United States Patent
Murakami et al.

(10) Patent No.: US 6,476,106 B1
(45) Date of Patent: Nov. 5, 2002

(54) POLYARYLENE SULFIDE RESIN COMPOSITION FOR ELECTRONIC PARTS ENCAPSULATION

(75) Inventors: Tomoyoshi Murakami; Yutaka Tsubokura; Shigemasa Suzuki; Satoru Kinouchi, all of Ichihara (JP)

(73) Assignee: Idemitsu Petrochemical Co., Ltd., Tokyo (JP)

( * ) Notice: Subject to any disclaimer, the term of this patent is extended or adjusted under 35 U.S.C. 154(b) by 0 days.

(21) Appl. No.: 09/622,054

(22) PCT Filed: Dec. 22, 1999

(86) PCT No.: PCT/JP99/07200

§ 371 (c)(1),
(2), (4) Date: Aug. 24, 2000

(87) PCT Pub. No.: WO00/39219

PCT Pub. Date: Jul. 6, 2000

(30) Foreign Application Priority Data

Dec. 24, 1998 (JP) ............ 10-366206

(51) Int. Cl.[7] .................................................. C08K 5/15
(52) U.S. Cl. ..................................................... 524/114
(58) Field of Search ........................................ 524/114

(56) References Cited

U.S. PATENT DOCUMENTS 5,214,083 A * 5/1993 Kodaira ........................ 524/95
5,604,287 A * 2/1997 Yamao ........................ 524/493
5,733,962 A   3/1998 Osako et al.
6,042,910 A   3/2000 Kinouchi et al.
6,117,950 A * 9/2000 Yamao ........................ 525/423

FOREIGN PATENT DOCUMENTS

| EP | 0 424 939 A3 | 5/1991 |
| EP | 0 424 939 A2 | 5/1991 |
| EP | 0 458 462 A1 | 11/1991 |
| EP | 0 852 249 A1 | 7/1998 |

* cited by examiner

Primary Examiner—Paul R. Michl
(74) Attorney, Agent, or Firm—Oblon, Spivak, McClelland, Maier & Neustadt, P.C.

(57) ABSTRACT

Provided is a polyarylene sulfide resin composition for sealing electronic parts, which comprises (A) from 20 to 35% by weight of a polyarylene sulfide resin, (B) from 60 to 75% by weight of silica, and (C) from 1 to 10% by weight of an elastomer, and contains (D) from 0.05 to 1.2 parts by weight of an epoxysilane and/or (E) from 0.1 to 3 parts by weight of an epoxy resin, both relative to 100 parts by weight of the total amount of the components (A), (B) and (C). The composition has good PCT and TCT acceptable quality and good fluidity, naturally having good properties intrinsic to ordinary PAS resin, and which, when used for sealing electronic parts, causes neither deformation of bonding wires and other elements nor package breakdown, and is therefore favorable to materials for sealing electronic parts.

28 Claims, No Drawings

POLYARYLENE SULFIDE RESIN COMPOSITION FOR ELECTRONIC PARTS ENCAPSULATION

TECHNICAL FIELD

The present invention relates to a polyarylene sulfide resin composition for sealing electronic parts. Precisely, it relates to a polyarylene sulfide (hereinafter often referred to as PAS) resin composition suitable for sealing semiconductors such as diodes, transistors, LSIs, CCD devices, ICs, etc.; as well as capacitors, resistors, coils, micro switches, dip switches, etc.

BACKGROUND ART

Polyarylene sulfide resins are engineering plastics having good heat resistance, good flame resistance and good electric and mechanical properties, and are known to be widely usable in the field of electronic parts, electric parts, etc., especially as sealants for electronic parts (for example, Japanese Patent Laid-Open Nos. 266461/1986, 296062/1986, 150752/1987, 45560/1992, 202245/1993, etc.). In these, however, polyarylene sulfide resins are problematic in that the driving reliability of the devices with parts sealed with them is not good after heat cycles.

In general, electronic parts to be sealed include silicon chips, lead frames and others, and are so fabricated that the lead wires therein are electrically connected with aluminium circuits via bonding wires. Where such electronic parts are sealed with resin such as PAS, generally employed is a method of first inserting silicon chips into a mold, and thereafter feeding resin pellets into a screw-in-line type injection-molding machine or the like, in which the silicon chips are sealed with the resin.

The matters especially important to the materials to be used for sealing electronic parts are PCT (pressure cooker test) and TCT (thermal cycle test). In addition, it is also important that the materials for that purpose have good fluidity and do not cause package breakdown. Sealants with poor fluidity will cause deformation or breakdown of bonding wires while they are applied to electronic parts through injection molding.

Referring to the prior art techniques, no one has as yet obtained sealants for electronic parts that satisfy all such fundamental requirements.

We, the present inventors have made the present invention, taking the problems noted above into consideration. The object of the invention is to provide a PAS resin composition which has good PCT and TCT acceptable quality and good fluidity, naturally having good properties intrinsic to ordinary PAS resin, and which, when used for sealing electronic parts, does not cause deformation of bonding wires and other elements, and does not cause package breakdown as its strength is not lowered. Therefore, the PAS resin composition which the invention is to provide is specifically favorable to materials for sealing electronic parts.

DISCLOSURE OF THE INVENTION

We, the present inventors have assiduously studied, and, as a result, have found that a polyarylene sulfide resin composition comprising specific components can attain the object as above.

Specifically, the invention provides the following:

(1) A polyarylene sulfide resin composition for sealing electronic parts, which comprises (A) from 20 to 35% by weight of a polyarylene sulfide resin, (B) from 60 to 75% by weight of silica, and (C) from 1 to 10% by weight of an elastomer, and further contains (D) from 0.05 to 1.2 parts by weight, relative to 100 parts by weight of the total amount of the components (A), (B) and (C), of an epoxysilane.

(2) A polyarylene sulfide resin composition for sealing electronic parts, which comprises (A) from 20 to 35% by weight of a polyarylene sulfide resin, (B) from 60 to 75% by weight of silica, and (C) from 1 to 10% by weight of an elastomer, and further contains (E) from 0.1 to 3 parts by weight, relative to 100 parts by weight of the total amount of the components (A), (B) and (C), of an epoxy resin.

(3) A polyarylene sulfide resin composition for sealing electronic parts, which comprises (A) from 20 to 35% by weight of a polyarylene sulfide resin, (B) from 60 to 75% by weight of silica, and (C) from 1 to 10% by weight of an elastomer, and further contains (D) from 0.05 to 1.2 parts by weight of an epoxysilane and (E) from 0.1 to 3 parts by weight of an epoxy resin, both relative to 100 parts by weight of the total amount of the components (A), (B) and (C).

(4) The polyarylene sulfide resin composition for sealing electronic parts of any one of (1) to (3), wherein the elastomer (C) is an ethylenic copolymer of ethylene, an alkyl $\alpha,\beta$-unsaturated-carboxylate, and maleic anhydride, with the repetitive units being from 50 to 90% by weight, from 5 to 49% by weight, and from 0.5 to 10% by weight, respectively.

(5) A method for sealing electronic parts with a polyarylene sulfide resin composition, in which the composition comprises (A) from 20 to 35% by weight of a polyarylene sulfide resin, (B) from 60 to 75% by weight of silica, and (C) from 1 to 10% by weight of an elastomer, and further contains (D) from 0.05 to 1.2 parts by weight, relative to 100 parts by weight of the total amount of the components (A), (B) and (C), of an epoxysilane.

(6) A method for sealing electronic parts with a polyarylene sulfide resin composition, in which the composition comprises (A) from 20 to 35% by weight of a polyarylene sulfide resin, (B) from 60 to 75% by weight of silica, and (C) from 1 to 10% by weight of an elastomer, and further contains (E) from 0.1 to 3 parts by weight, relative to 100 parts by weight of the total amount of the components (A), (B) and (C), of an epoxy resin.

(7) A method for sealing electronic parts with a polyarylene sulfide resin composition, in which the composition comprises (A) from 20 to 35% by weight of a polyarylene sulfide resin, (B) from 60 to 75% by weight of silica, and (C) from 1 to 10% by weight of an elastomer, and further contains (D) from 0.05 to 1.2 parts by weight of an epoxysilane and (E) from 0.1 to 3 parts by weight of an epoxy resin, both relative to 100 parts by weight of the total amount of the components (A), (B) and (C).

BEST MODES OF CARRYING OUT THE INVENTION

The invention is described in detail hereinunder.

(A) Polyarylene Sulfide Resin

The polyarylene sulfide (PAS) (A) for use in the invention is a polymer having repetitive units of a structural formula, —Ar—S— wherein Ar indicates an arylene group, in an amount of at least 70 mol %. Typically, it is a polyphenylene sulfide (hereinafter often referred to as PPS) having repetitive units of the following chemical formula (I), in an amount of at least 70 mol %.

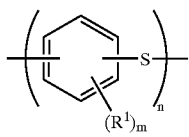

(I)

wherein $R^1$ indicates a substituent selected from an alkyl or alkoxy group having at most 6 carbon atoms, a phenyl group, a group of a carboxylic acid or its metal salt, a nitro group, or a halogen atom including fluorine, chlorine and bromine atoms; m indicates an integer of from 0 to 4; and n indicates a degree of polymerization falling between 1.3 and 30.

Depending on the method for producing it, it is known that PAS includes two types, one having a substantially linear molecular structure with neither branches or crosslinks, and the other having a branched or crosslinked molecular structure. Any type of PAS is usable in the invention with no specific limitation.

Preferred PAS for use in the invention is a homopolymer or a copolymer having at least 70 mol %, more preferably at least 80 mol % of repetitive paraphenylene sulfide units. PAS of which the repetitive paraphenylene sulfide unit content is smaller than 70 mol % is unfavorable, as it will lose its intrinsic crystallinity characteristic of crystalline polymer and its mechanical properties will be poor. The comonomer units for the copolymer polyarylene sulfide include, for example, metaphenylene sulfide units, orthophenylene sulfide units, p,p'-diphenyleneketone sulfide units, p,p'-diphenylenesulfone sulfide units, p,p'-biphenylene sulfide units, p,p'-diphenyleneether sulfide units, p,p'-diphenylenemethylene sulfide units, p,p'-diphenylenecumenyl sulfide units, naphthyl sulfide units, etc.

The PAS resin can be obtained in any per-se known method of, for example, polycondensation of a dihaloaromatic compound with a sulfur source in an organic polar solvent. The melt viscosity of the PAS resin for use in the invention is not specifically defined, but preferably falls between 5 and 100 Pa·s at 300° C. at 200 sec$^{-1}$.

(B) Silica

Silica has a small linear expansion coefficient, and is used herein for the purpose of improving the adhesiveness of the composition to chips and lead frames of electronic parts and also to bonding wires.

The type of silica to be used in the invention is not specifically defined. For example, herein usable is amorphous silica such as broken silica, as well as spherical silica such as fused silica or synthetic silica. Plural types of silica may be blended for use herein. The grain size and the grain size distribution of silica for use herein are not also specifically defined. Preferably used is silica having a mean grain size of at most 50 μm.

Silica for use herein may be previously treated on its surface with a silane coupling agent or the like. The coupling agent for the surface treatment is any known one. For example, it includes aminosilanes and epoxysilanes such as γ-aminopropyltrimethoxysilane, N-β-(aminoethyl)-γ-aminopropyltrimethoxysilane, γ-glycidoxypropyltrimethoxysilane, β-(3,4-epoxycyclohexyl)ethyltrimethoxysilane, etc.; and also vinylsilanes, mercaptosilanes, etc.

(C) Elastomer

The elastomer for use in the invention is not specifically defined, including, for example, olefinic elastomers, polyamide elastomers, polyester elastomers, vinyl copolymer elastomers, dienic elastomers, silicone elastomers, etc.

The olefinic elastomers include graft copolymers that may be prepared by grafting α-olefinic stem polymers with unsaturated carboxylic acids or their anhydrides. The α-olefins include polymers and copolymers of ethylene, propylene, butene-1, isobutene, pentene-1, 4-methyl-pentene-1, etc. The unsaturated carboxylic acids and their anhydrides include maleic acid, fumaric acid, itaconic acid, methylmaleic acid, acrylic acid, methacrylic acid, crotonic acid, citraconic acid, maleic anhydride, methylmaleic anhydride, glycidyl acrylate, etc. Concretely, the olefinic elastomers include ethylenic copolymers from monomers of ethylene, an alkyl α,β-unsaturated carboxylate, and maleic anhydride, with the repetitive monomer units being from 50 to 90% by weight, from 5 to 49% by weight, and from 0.5 to 10% by weight, respectively, preferably from 60 to 85% by weight, from 7 to 45% by weight, and from 1 to 8% by weight, respectively. The alkyl α,β-unsaturated carboxylate includes alkyl esters of unsaturated C3–8 carboxylic acids, for example, methyl acrylate, ethyl acrylate, n-propyl acrylate, isopropyl acrylate, n-butyl acrylate, isobutyl acrylate, t-butyl acrylate, methyl methacrylate, ethyl methacrylate, n-propyl methacrylate, isopropyl methacrylate, n-butyl methacrylate, isobutyl methacrylate, t-butyl methacrylate, etc. Preferably, the ethylenic copolymers have MI (as measured at 190° C. under a load of 2.16 kg) of from 0.1 to 1000, more preferably from 0.2 to 500, even more preferably from 1 to 100.

The polyamide elastomers include polyamide block copolymers comprising polyamide hard segments coupled with other soft segments. Typically, the soft segments are, for example, from polyalkylene oxides (in which the alkyl group has from 2 to 6 carbon atoms). The polyamide component for the hard segments includes, for example, polyamides such as polyamide 6, polyamide 66, polyamide 6–12, polyamide 11, polyamide 12, etc. The polyether component for the soft segments includes, for example, polyoxyethylene glycol, polyoxypropylene glycol, polyoxytetramethylene glycol, etc.

The polyester elastomers include multi-block polymers comprising hard segments from high-crystalline aromatic polyesters and soft segments from amorphous polyethers or aliphatic polyesters. The hard segments include, for example, those from terephthalate-type crystalline polyesters such as polyethylene terephthalate, polybutylene terephthalate, polycyclohexanedimethylene terephthalate, etc. The soft segments include, for example, those from aliphatic polyethers such as polytetramethylene ether glycol, polypropylene glycol, polyethylene glycol, etc.; and aliphatic polyesters to be prepared from aliphatic dicarboxylic acids such as oxalic acid, malonic acid, succinic acid, glutaric acid, adipic acid, pyromellitic acid, suberic acid, azelaic acid, sebacic acid and the like, and glycols such as ethylene glycol, propylene glycol, butanediol, pentanediol, neopentyl glycol, hexanediol, octanediol, decanediol and the like.

The dienic elastomers include, for example, natural rubbers, polybutadienes, polyisoprenes, polyisobutylenes, neoprenes, polysulfide rubbers, Thiokol rubbers, acrylic rubbers, urethane rubbers, silicone rubbers, epichlorohydrin rubbers, styrene-butadiene block copolymers (SBR), hydrogenated styrene-butadiene block copolymers (SEB, SEBC), styrene-butadiene-styrene block copolymers (SBS), hydrogenated styrene-butadiene-styrene block copolymers (SEBS), styrene-isoprene block copolymers (SIR), hydrogenated styrene-isoprene block copolymers (SEP), styreneisoprene-styrene block copolymers (SIS), hydrogenated styrene-isoprene-styrene block copolymers (SEPS), ethylene propylene rubbers (EPM), ethylene-propylene-diene rubbers (EPDM); core/shell type granular elastomers such as butadiene-acrylonitrile-styrene core/shell rubbers (ABS), methyl methacrylate-butadiene-styrene core/shell rubbers (MBS), methyl methacrylate-butyl acrylate-styrene core/shell rubbers (MAS), octyl acrylate-butadiene-styrene core/shell rubbers (MABS), alkyl acrylate-butadiene-acrylonitrile-styrene core/shell rubbers (AABS), butadiene-styrene core/shell rubbers (SBR), siloxane-containing core/shell rubbers, e.g., methyl methacrylate-butyl acrylate-siloxanes core/shell rubbers, etc.; modificates as prepared by modifying these rubbers, etc.

They further include polyorganosiloxane rubbers, and preferred are copolymers as prepared by copolymerizing polyorganosiloxanes with crosslinking agents. The polyorganosiloxanes include, for example, hexamethylcyclotrisiloxane, octamethylcyclotetrasiloxane, decamethylcyclopentasiloxane, dodecamethylcyclohexasiloxane, trimethyltriphenylcyclotrisiloxane, tetramethyltetraphenylcyclotetrasiloxane, etc. The crosslinking agents include, for example, trifunctional or tetrafunctional siloxane-type crosslinking agents such as trimethoxymethylsilane, triethoxyphenylsilane, tetramethoxysilane, tetraethoxysilane, tetrabutoxysilane, etc.

(D) Epoxysilane

The epoxysilane is meant to indicate an epoxy group-having silane compound. Preferred are silane compounds having at least one epoxy group and at least one Si—OR group (where R indicates an alkyl group) in one molecule. R may be an alkyl group having from 1 to 20 carbon atoms, and is preferably an alkyl group having from 1 to 10 carbon atoms. Concretely, the epoxysilane includes γ-glycidoxypropyltrimethoxysilane, β-(3,4-epoxycyclohexyl)ethyltrimethoxysilane, γ-glycidoxypropyltriethoxysilane, etc. The method of adding the epoxysilane to the composition of the invention is not specifically defined. For example, it may be added to the composition through integral blending or the like.

(E) Epoxy Resin

The epoxy resin has one or more epoxy groups, and may be liquid or solid. It includes glycidylepoxy resins, for example, glycidyl ethers of bisphenols such as bisphenol A, resorcinol, hydroquinone, pyrocatechol, bisphenol F, 1,3,5-trihydroxybenzene, trihydroxydiphenyldimethylmethane, 4,4'-dihydroxybiphenyl, etc., diglycidyl ethers of halogenobisphenol-butanediols but not bisphenols, glycidyl esters such as glycidyl phthalate, etc., glycidylamines such as N-glycidylaniline, etc.; cyclic non-glycidyl epoxy resins such as epoxypolyolefins, dicyclopentadiene-dioxide, etc.; novolak epoxy resins to be prepared by reacting novolak phenolic resins with epichlorohydrin; and their substituents substituted with any of halogens such as chlorine, bromine, etc., alkoxy groups, carboxyl groups, hydroxyl groups, etc. As the novolak phenolic resins, preferred are those to be prepared through condensation of phenols with formaldehyde.

(F) Other Components

The PAS resin composition of the invention may optionally contain any other components, in addition to the components mentioned above, so far as the additional components do not interfere with the object of the invention. The additional components include, for example, various additives such as inorganic fillers, antioxidants, heat stabilizers, lubricants, colorants, plasticizers, electroconductive agents, etc.; thermoplastic or thermosetting resins such as polyamides, silicone resins, silicone oils, silicone soils having various functional groups, polyolefins, polyether sulfones, polyphenylene ethers, etc.; pigments, etc.

The inorganic fillers may be granular or powdery ones, and even any others. For example, the granular or powdery inorganic fillers include talc, titanium dioxide, silica not corresponding to the component (B) in the invention, mica, calcium carbonate, calcium sulfate, barium carbonate, magnesium carbonate, magnesium sulfate, barium sulfate, oxysulfates, tin oxide, alumina, kaolin, silicon carbide, glass powder, glass flakes, glass beads, etc.

The inorganic fillers for use herein may be treated on their surfaces with a coupling agent or the like, for improving their adhesiveness to resin. The coupling agent to be used for that purpose may be selected from silane coupling agents, titanium coupling agents, and other known coupling agents.

The amount of the additional components that may be in the composition may be suitably determined, without interfering with the object of the invention.

3. Blend Ratio of the Components Constituting the PAS Resin Composition of the Invention The blend ratio of the components constituting the PAS resin composition of the invention is as follows: In the composition (1), the amount of (A) polyarylene sulfide resin falls between 20 and 35% by weight, preferably between 20 and 30% by weight, that of (B) silica falls between 60 and 75% by weight, preferably between 62 and 73% by weight, and that of (C) elastomer falls between 1 and 10% by weight, preferably between 2 and 8% by weight; and the amount of (D) epoxysilane falls between 0.05 and 1.2 parts by weight, preferably between 0.1 and 1.2 parts by weight, relative to 100 parts by weight of the total amount of the components (A), (B) and (C).

In the composition (2), the amount of (A) polyarylene sulfide resin falls between 20 and 35% by weight, preferably between 20 and 30% by weight, that of (B) silica falls between 60 and 75% by weight, preferably between 62 and 73% by weight, and that of (C) elastomer falls between 1 and 10% by weight, preferably between 2 and 8% by weight; and the amount of (E) epoxy resin falls between 0.1 and 3 parts by weight, preferably between 0.3 and 2.5 parts by weight, relative to 100 parts by weight of the total amount of the components (A), (B) and (C).

If desired, the composition may contain both the components (D) and (E).

If the amount of the polyarylene sulfide resin (A) is smaller than 20% by weight, the fluidity of the composition will be low. If so, the composition will deform wires when used for sealing electronic parts. On the other hand, if the amount of (A) is larger than 35% by weight, the fraction defective in PCT and TCT of the composition will increase. If the amount of the component (B) silica is smaller than 60% by weight, the fraction defective in PCT and TCT of the composition will increase. On the other hand, if the amount of (B) is larger than 75% by weight, the fluidity of the composition will be low. If so, the composition will deform wires when used for sealing electronic parts. If the amount of the elastomer (C) is smaller than 1% by weight, the fraction defective in PCT and TCT of the composition will also increase. On the other hand, if the amount of (C) is larger than 10% by weight, the strength of the composition will be low. If the amount of the epoxysilane (D) is smaller than 0.05 parts by weight, the strength of the composition will be low, often causing package breakdown when the composition is used for sealing electronic parts. If, on the other hand, the amount of (D) is larger than 1.2 parts by weight, the fluidity of the composition will be low, often causing wire deformation when the composition is used for sealing electronic parts. If the amount of the epoxy resin (E) is smaller than 0.1 parts by weight, the strength of the composition will be also low, often causing package breakdown when the composition is used for sealing electronic parts. If, on the other hand, the amount of (E) is larger than 3 parts by weight, the fluidity of the composition will be also low, often causing wire deformation when the composition is used for sealing electronic parts.

4. Preparation of PAS Resin Composition

The PAS resin composition may be prepared by blending the constituent components mentioned above, optionally along with the additional components that may be selectively added to the composition. For example, the components maybe kneaded in melt to prepare the composition.

Kneading the components in melt may be effected in any ordinary known manner. Anyhow, the components shall be uniformly mixed and dispersed in the resin to prepare the intended resin composition. For kneading the components in melt, favorably used is a double-screw extruder, a single-screw extruder or the like.

The conditions for kneading the components in melt are not specifically defined. Preferably, however, too high temperatures or too long residence time shall be evaded so as to prevent the optional components from being decomposed or foamed. Concretely, the temperature may fall generally between 280 and 350° C., but preferably between 285 and 330° C.

The PAS resin composition thus prepared in the manner as above is generally granulated or pelletized into pellets or others having desired shapes or sizes suitable for secondary processing, before it is applied to molding, especially injection molding.

5. Use for Sealing Electronic Parts

The PAS resin composition of the invention is favorably used for electronic parts or for sealing electronic parts. The type of the electronic parts to which the composition is applied is not specifically defined. For example, the composition is applicable to various electronic devices such as integrated circuit devices including, for example, diodes, transistors, LSIs, CCD devices, ICs, etc., and also to capacitors, resistors, coils, micro switches, dip switches, etc.

The PAS resin composition of the invention is described more concretely with reference to the following Examples.

EXAMPLES 1 TO 16, COMPARATIVE EXAMPLES 1 TO 13

Using a Henschel mixer, the components shown in Table 1 and Table 2 below were uniformly blended in the ratio indicated in those Tables, and the resulting blend was kneaded in melt and pelletized into pellets by the use of a double-screw extruder (Toshiba Machine's TEM35) in which the temperature of the cylinder was controlled to fall between 280 and 350° C.

In the Tables, the amount of each component is designated as follows: For the components (A), (B), (C), (F) and (G), the amount of each component is in terms of % by weight relative to 100% by weight of the total amount of all these components. For the components (D) and (E), the amount of each component is in terms of parts by weight relative to 100 parts by weight of the total amount of the components (A), (B), (C), (F) and (G). The blanks indicate 0 (zero).

<Constituent Components>
Component (A) (PAS)
<1> PPS-1:

833 mols of sodium sulfide hydrate ($Na_2S5H_2O$), 830 mols of lithium chloride (LiCl) and 500 liters of NMP were put into a polymerization reactor equipped with a stirrer, and dehydrated at 145° C. under reduced pressure for 1 hour. Next, the reaction system was cooled to 45° C., and 905 mols of dichlorobenzene (DCB) was added thereto, and the monomers were polymerized at 260° C. for 3 hours. The reaction mixture was washed five times with hot water, once with N-methyl-2-pyrrolidone (NMP) at 170° C., and three times with water, and then dried at 185° C. to obtain PPS-1.

The melt viscosity of PPS-1 was 12 Pa·s at 300° C. at 200 $sec^{-1}$.

<2> PPS-2:

PPS-2 was prepared in the same manner as above for preparing PPS-1, except that the polymerization time and the number of washing operations were varied.

Its melt viscosity was 40 Pa·s at 300° C. at 200 $sec^{-1}$.

<3> PPS-3:

This is Semilinear PPSH1 from Toprene.

Its melt viscosity was 11 Pa·s at 300° C. at 200 $sec^{-1}$.

<4> PPS-4:

This is Crosslinked PPSK1 from Toprene.

Its melt viscosity was 12 Pa·s at 300° C. at 200 $sec^{-1}$.

Component (B) (Silica)
<1> Silica 1:

This is FB74 from Denki Kagaku, having a mean grain size of 31.5 μm.

<2>Silica 2:

Silica 1 was treated on its surface with an epoxysilane (D) mentioned below to prepare Silica 2.

<3> Silica 3:

This is FB600 from Denki Kagaku, having a mean grain size of 28 μm.

<4> Silica 4:

This is FB6D from Denki Kagaku, having a mean grain size of 6 μm.

<5> Silica 5:

This is Admafine SO-C2 from Admatex, having a mean grain size of 0.5 Mm.

Component (C) (Elastomer)
<1> Elastomer 1:

This is a copolymer of ethylene-ethyl acrylate-maleic anhydride, Bondine AX8390 (trade name) from Sumitomo Chemical, having an ethylene content of 68% by weight, an ethyl acrylate content of 30% by weight and a maleic anhydride content of 2% by weight.

<2> Elastomer 2:

This is a copolymer of ethylene-ethyl acrylate-maleic anhydride, Bondine HX8290 (trade name) from Sumitomo Chemical, having an ethylene content of 85% by weight, an ethyl acrylate content of 13% by weight and a maleic anhydride content of 2% by weight.

<3> Elastomer 3:

This is an epoxy group-having silicone powder, DC4-7051 from Toray-Dow Corning Silicone.

(D) Epoxysilane

This is γ-glycidoxypropyltrimethoxysilane, SH6040 from Toray-Dow Corning Silicone.

(E) Epoxy Resin

This is a cresol-novolak epoxy resin, ECN1299 from Ciba-Geigy (having an epoxy equivalent of from 217 to 244).

(F) Glass Fibers (GF)

This is chopped glass JAFT591 from Asahi Fiber Glass.

(G) Calcium Carbonate

This is calcium carbonate P-30 from Shiraishi Industry.

<Evaluation of Physical Properties>

<1> Spiral flow length (SFL):

Using a 30-ton injection-molding machine (from Toshiba Machine), prepared were sample strips having a thickness of 1 mm, for which the cylinder temperature was 320° C., a mold temperature was 135° C. and the injection pressure was 1000 kg/cm$^2$. The length (mm) of the sample flow having been injected in that condition was measured, and this indicates the spiral flow length of the sample tested. The spiral flow length is an index of the fluidity of the sample to be molded through injection molding. Samples having a larger spiral flow length have better fluidity.

<2> Flexural Strength (unit: MPa): Measured according to ASTMD790.

<3> Wire Deformation:

A resin composition to be tested was applied to a chip with a 250 mmφ aluminium bonding wire being attached to the chip vertically to the resin flow, and the chip with the bonding wire was molded through insert molding whereupon the condition of the wire was macroscopically checked.

Chip samples with no wire deformation were designated by OO; those with minor wire deformation were by O; those with significant wire deformation were by Δ; and those with great wire deformation were by x.

<4> Percent Defective in PCT (Pressure Cooker Test):

PCT was conducted according to JIS C5030. Precisely, chip samples sealed with a resin composition to be tested were processed with hot pressure steam in a pressure cooker at a temperature of 121° C. and a relative humidity of 100% and under a pressure of 2.02 atmospheres for 500 hours, and the defective chips were counted to obtain the percent defective (%). For evaluating them, the tested chips were immersed in red ink at 90° C. for 3 hours, and then dried in air for 24 hours, and their package was opened. The chips stained with red ink were evaluated "bad". The percent defective in PCT indicates the wet heat resistance of the resin composition tested.

<5> Percent Defective in TCT (Thermal Cycle Test):

TCT was conducted according to JIS C5030. Precisely, chip samples sealed with a resin composition to be tested were subjected to 300 heat cycles, one heat cycle comprising heating the ship samples at 130° C. for 1 hour followed by cooling them at −40° C. for 1 hour, and the defective chips were counted to obtain the percent defective (%). For evaluating them, the tested chips were immersed in red ink at 90° C. for 3 hours, and then dried in air for 24 hours, and their package was opened. The chips stained with red ink were evaluated "bad". The percent defective in TCT indicates the heat shock resistance of the resin composition tested.

<Test Data>

The test-data are shown in Table 1 and Table 2.

TABLE 1

|  | Example | | | | | | | | | | | | | | | |
| --- | --- | --- | --- | --- | --- | --- | --- | --- | --- | --- | --- | --- | --- | --- | --- | --- |
|  | 1 | 2 | 3 | 4 | 5 | 6 | 7 | 8 | 9 | 10 | 11 | 12 | 13 | 14 | 15 | 16 |
| (A) PAS | | | | | | | | | | | | | | | | |
| PPS 1 | 25 | 33 | 10 | 20 | 23 | 25 | 22 | 26 | 35 | 35 |  | 28 | 28 |  | 29 | 25 |
| PPS 2 |  |  | 25 |  |  |  |  |  |  |  | 27 |  |  |  |  |  |
| PPS 3 |  |  |  |  |  |  |  |  |  |  | 27 |  |  |  |  |  |
| PPS 4 |  |  |  |  |  |  |  |  |  |  |  |  |  | 32 |  |  |
| (B) Silica | | | | | | | | | | | | | | | | |
| Silica 1 | 70 | 66 | 62 |  | 70 | 55 | 73 | 68 | 62 |  |  | 68 | 67 | 65 |  |  |
| Silica 2 |  |  |  |  |  |  |  |  |  |  |  |  |  |  |  | 70 |
| Silica 3 |  |  |  | 72 |  |  |  |  |  | 55 | 68 |  |  |  | 62 |  |
| Silica 4 |  |  |  |  |  |  |  |  |  |  |  |  |  |  |  |  |
| Silica 5 |  |  |  |  |  | 10 |  |  |  | 7 |  |  |  |  |  |  |
| (C) Elastomer | | | | | | | | | | | | | | | | |
| Elastomer 1 | 5 | 2 | 3 | 8 |  | 5 | 5 | 6 | 3 | 3 | 5 | 3 |  | 3 |  | 5 |
| Elastomer 2 |  |  |  |  | 7 |  |  |  |  |  |  |  |  |  |  |  |
| Elastomer 3 |  |  |  |  |  |  |  |  |  |  |  |  | 3 | 5 | 9 |  |
| (D) Epoxysilane | 0.3 | 0.6 | 0.1 | 1.2 | 0.3 | 0.3 |  |  |  |  | 0.5 |  | 0.2 |  | 0.5 | 0.3 |
| (E) Epoxy Resin |  |  |  |  |  |  | 0.3 | 1.5 | 2.5 | 2.5 |  | 1.5 |  | 1.0 |  |  |
| Test Data | | | | | | | | | | | | | | | | |
| SFL (mm) | 130 | 101 | 121 | 108 | 134 | 157 | 115 | 102 | 113 | 140 | 131 | 96 | 123 | 111 | 117 | 127 |
| Flexural Strength (MPa) | 57 | 116 | 67 | 51 | 50 | 66 | 78 | 93 | 96 | 99 | 52 | 88 | 65 | 74 | 61 | 64 |
| Wire Deformation | OO | O | OO | O | OO | OO | O | O | O | OO | OO | O | OO | O | OO | OO |
| Percent Defective (%) in PCT | 0 | 5 | 5 | 0 | 0 | 0 | 0 | 0 | 5 | 5 | 0 | 0 | 0 | 10 | 0 | 0 |
| Percent Defective (%) in TCT | 0 | 5 | 5 | 0 | 0 | 0 | 0 | 0 | 5 | 0 | 0 | 0 | 0 | 5 | 0 | 0 |

TABLE 2

| | Comparative Example | | | | | | | | | | | | |
|---|---|---|---|---|---|---|---|---|---|---|---|---|---|
| | 1 | 2 | 3 | 4 | 5 | 6 | 7 | 8 | 9 | 10 | 11 | 12 | 13 |
| (A) PAS | | | | | | | | | | | | | |
| PPS1 | 18 | 39 | 25 | 24 | | 22 | 25 | 29 | 30 | 30 | 30 | 30 | 30 |
| PPS2 | | | | | 25 | | | | | | | | |
| (B) Silica | | | | | | | | | | | | | |
| Silica 1 | 78 | 57 | 64 | 62 | 70 | 73 | 70 | 62 | 70 | 70 | 50 | | |
| (C) Elastomer | | | | | | | | | | | | | |
| Elastomer 1 | 4 | 4 | 11 | | 5 | 5 | 5 | | | | 5 | 10 | 5 |
| Elastomer 3 | | | | 14 | | | | 9 | | | | | |
| (D) Epoxysilane | 0.5 | 0.3 | 0.6 | 0.5 | 1.5 | | | | | 0.3 | 0.3 | 0.5 | 0.3 |
| (E) Epoxy Resin | | | | | | 4.0 | | | | | | | |
| (F) GF | | | | | | | | | | | 15 | 60 | |
| (G) Calcium Carbonate | | | | | | | | | | | | | 70 |
| Test Data | | | | | | | | | | | | | |
| SFL (mm) | 37 | 214 | 134 | 97 | 43 | 68 | 148 | 153 | 94 | 86 | 115 | 205 | 107 |
| Flexural Strength (MPa) | 36 | 36 | 38 | 37 | 66 | 103 | 31 | 40 | 52 | 68 | 102 | 136 | 53 |
| Wire Deformation | x | ∘∘ | ∘∘ | Δ | x | x | ∘∘ | ∘∘ | Δ | Δ | Δ | Δ | ∘ |
| Percent Defective (%) in PCT | 10 | 50 | 0 | 0 | 5 | 0 | 5 | 5 | 40 | 30 | 100 | 100 | 90 |
| Percent Defective (%) in TCT | 10 | 60 | 0 | 0 | 10 | 0 | 0 | 5 | 30 | 30 | 100 | 100 | 70 |

INDUSTRIAL APPLICABILITY

As described hereinabove, obtained is a PAS resin composition which has good PCT and TCT acceptable quality and good fluidity, naturally having good properties intrinsic to ordinary PAS resin, and which, when used for sealing electronic parts, causes neither deformation of bonding wires and other elements nor package breakdown, and is therefore specifically favorable to materials for sealing electronic parts.

What is claimed is:

1. A polyarylene sulfide resin composition for sealing electronic parts, which comprises (A) from 20 to 35% by weight of a polyarylene sulfide resin, (B) from 60 to 75% by weight of silica, and (C) from 1 to 10% by weight of an elastomer, and further contains (D) from 0.05 to 1.2 parts by weight, relative to 100 parts by weight of the total amount of the components (A), (B) and (C), of an epoxysilane.

2. A polyarylene sulfide resin composition for sealing electronic parts, which comprises (A) from 20 to 35% by weight of a polyarylene sulfide resin, (B) from 60 to 75% by weight of silica, and (C) from 1 to 10% by weight of an elastomer, and further contains (E) from 0.1 to 3 parts by weight, relative to 100 parts by weight of the total amount of the components (A), (B) and (C), of an epoxy resin.

3. A polyarylene sulfide resin composition for sealing electronic parts, which comprises (A) from 20 to 35% by weight of a polyarylene sulfide resin, (B) from 60 to 75% by weight of silica, and (C) from 1 to 10% by weight of an elastomer, and further contains (D) from 0.05 to 1.2 parts by weight of an epoxysilane and (E) from 0.1 to 3 parts by weight of an epoxy resin, both relative to 100 parts by weight of the total amount of the components (A), (B) and (C).

4. The polyarylene sulfide resin composition for sealing electronic parts as claimed, wherein the elastomer (C) is an ethylenic copolymer of ethylene, an alkyl α,β-unsaturated carboxylate, and maleic anhydride, with the repetitive units being from 50 to 90% by weight, from 5 to 49% by weight, and from 0.5 to 10% by weight, respectively.

5. A method for sealing electronic parts with a polyarylene sulfide resin composition, comprising contacting an electronic part with the polyarylene sulfide resin composition, wherein the polyarylene sulfide resin composition comprises (A) from 20 to 35% by weight of a polyarylene sulfide resin, (B) from 60 to 75% by weight of silica, and (C) from 1 to 10% by weight of an elastomer, and further contains (D) from 0.05 to 1.2 parts by weight, relative to 100 parts by weight of the total amount of the components (A), (B) and (C), or an epoxysilane.

6. A method for sealing electronic parts with a polyarylene sulfide resin composition, comprising contacting an electronic part with the polyarylene sulfide resin composition, wherein the polyarylene sulfide resin composition comprises (A) from 20 to 35% by weight of a polyarylene sulfide resin, (B) from 60 to 75% by weight of silica, and (C) from 1 to 10% by weight of an elastomer, and further contains (E) from 0.1 to 3 parts by weight, relative to 100 parts by weight of the total amount of the components (A), (B) and (C), of an epoxy resin.

7. A method for sealing electronic parts with a polyarylene sulfide resin composition, comprising contacting an electronic part with the polyarylene sulfide resin composition, wherein the polyarylene sulfide resin composition comprises (A) from 20 to 35% by weight of a polyarylene sulfide resin, (B) from 60 to 75% by weight of silica, and (C) from 1 to 10% by weight of an elastomer, and further contains (D) from 0.05 to 1.2 parts by weight of an epoxysilane and (E) from 0.1 to 3 parts by weight of an epoxy resin, both relative to 100 parts by weight of the total amount of the components (A), (B) and (C).

8. The polyarylene sulfide resin composition of claim 1, wherein the polyarylene sulfide resin has at least 70 mol % of repeat units of formula (I):

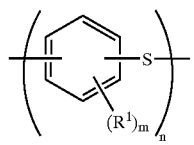
(I)

wherein R¹ is a substituent selected from the group consisting of an alkyl group, an alkoxy group having at most 6 carbon atoms, a phenyl group, a carboxylic acid group, a metal salt of a carboxylic acid and a halogen atom; m is an integer of from 0 to 4; and n is a degree of polymerization of between 1.3 and 30.

9. The polyarylene sulfide resin composition of claim 2, wherein the polyarylene sulfide resin has at least 70 mol % of repeat units of formula (I):

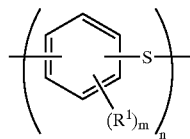
(I)

wherein R¹ is a substituent selected from the group consisting of an alkyl group, an alkoxy group having at most 6 carbon atoms, a phenyl group, a carboxylic acid group, a metal salt of a carboxylic acid and a halogen atom; m is an integer of from 0 to 4; and n is a degree of polymerization of between 1.3 and 30.

10. The polyarylene sulfide resin composition of claim 1, wherein the polyarylene sulfide resin has a melt viscosity of 5 to 100 Pa·s at 300° C. of 200 sec⁻¹.

11. The polyarylene sulfide resin composition of claim 2, wherein the polyarylene sulfide resin has a melt viscosity of 5 to 100 Pa·s at 300° C. of 200 sec⁻¹.

12. The polyarylene sulfide resin composition of claim 1, wherein the silica has a mean grain size of at most 50 μm.

13. The polyarylene sulfide resin composition of claim 2, wherein the silica has a mean grain size of at most 50 μm.

14. The polyarylene sulfide resin composition of claim 1, wherein the elastomer is selected from the group consisting of olefinic elastomers, polyamide elastomers, polyester elastomers, vinyl copolymer elastomers, dienic elastomers, and silicone elastomers.

15. The polyarylene sulfide resin composition of claim 2, wherein the elastomer is selected from the group consisting of olefinic elastomers, polyamide elastomers, polyester elastomers, vinyl copolymer elastomers, dienic elastomers, and silicone elastomers.

16. The polyarylene sulfide resin composition of claim 1, wherein the epoxy silane has at least one epoxy group and at least one Si—OR group, and R is an alkyl group having from 1 to 20 carbon atoms.

17. The polyarylene sulfide resin composition of claim 1, wherein the epoxy silane is selected from the group consisting of γ-glycidoxypropyltrimethoxysilane, β-(3,4-epoxycyclohexyl)ethyltrimethoxysilane, γ-glycidoxypropyltriethoxysilane, and mixtures thereof.

18. The polyarylene sulfide resin composition of claim 2, wherein the epoxy resin is selected from the group consisting of glycidyl ethers of bisphenol A, glycidyl ethers of resorcinol, glycidyl ethers of hydroxyquinone, glycidyl ethers of pyrocatechol, glycidyl ethers of bisphenol F, glycidyl ethers of 1,3,5-trihydroxybenzene, glycidyl ethers of trihydroxydiphenyldimethylmethane, glycidyl ethers of 4,4'-dihydroxybiphenol, diglycidyl ethers of halogenobisphenol-butanediols, glycidyl phthalate, N-glycidylaniline, epoxy polyolefins, dicyclopentadiene-dioxide, novolak epoxy resins, and mixtures thereof.

19. The polyarylene sulfide resin composition of claim 1, further comprising at least one additional component selected from the group consisting of inorganic fillers, antioxidants, heat stabilizers, lubricants, colorants, plasticizers, electroconductive agents, polyamides, silicone resins, silicone oils, functionalized silicone oils, polyolefins, polyether sulfones, polyphenylene ethers, and pigments.

20. The polyarylene sulfide resin composition of claim 2, further comprising at least one additional component selected from the group consisting of inorganic fillers, antioxidants, heat stabilizers, lubricants, colorants, plasticizers, electroconductive agents, polyamides, silicone resins, silicone oils, functionalized silicone oils, polyolefins, polyether sulfones, polyphenylene ethers, and pigments.

21. The polyarylene sulfide resin composition of claim 1, wherein the amount of the polyarylene sulfide resin is 20 to 30% by weight.

22. The polyarylene sulfide resin composition of claim 2, wherein the amount of the polyarylene sulfide resin is 20–30% by weight.

23. The polyarylene sulfide resin composition of claim 1, wherein the amount of silica is 62 to 73% by weight.

24. The polyarylene sulfide resin composition of claim 2, wherein the amount of silica is 62 to 73% by weight.

25. The polyarylene sulfide resin composition of claim 1, wherein the amount of elastomer is 2 to 8% by weight.

26. The polyarylene sulfide resin composition of claim 2, wherein the amount of elastomer is 2 to 8% by weight.

27. The polyarylene sulfide resin composition of claim 1, wherein the amount of epoxy silane is 0.1 to 1.2 parts by weight.

28. The polyarylene sulfide resin composition of claim 2, wherein the amount of epoxy resin is 0.3 to 2.5 parts by weight.

* * * * *